US 8,586,875 B2

(12) United States Patent
Morita et al.

(10) Patent No.: US 8,586,875 B2
(45) Date of Patent: *Nov. 19, 2013

(54) WIRING BOARD AND METHOD FOR MANUFACTURING THE SAME

(75) Inventors: Haruhiko Morita, Ogaki (JP); Atsushi Ishida, Ogaki (JP); Ryojiro Tominaga, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 126 days.

This patent is subject to a terminal disclaimer.

(21) Appl. No.: 12/956,753

(22) Filed: Nov. 30, 2010

(65) Prior Publication Data

US 2011/0209905 A1    Sep. 1, 2011

Related U.S. Application Data

(60) Provisional application No. 61/308,591, filed on Feb. 26, 2010.

(51) Int. Cl.
*H05K 1/11*    (2006.01)
(52) U.S. Cl.
USPC .......................................... 174/264; 172/262
(58) Field of Classification Search
None
See application file for complete search history.

(56) References Cited

U.S. PATENT DOCUMENTS 7,081,650 B2 *   7/2006   Palanduz et al. .............. 257/310
7,767,913 B2 *   8/2010   Corisis et al. ................. 174/262
8,227,706 B2 *   7/2012   Roy et al. ..................... 174/262

FOREIGN PATENT DOCUMENTS

JP    2002-204075    7/2002

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A wiring board includes a substrate having a first penetrating hole penetrating through the substrate, a first through-hole conductor formed on the inner wall of the first penetrating hole, a filler filled inside the first conductor and forming a second penetrating hole, and a second through-hole conductor formed in the second penetrating hole, a first conductive circuit formed on a first surface of the substrate; a second conductive circuit formed on a second surface of the substrate; a first conductive portion formed on one end of the second penetrating hole, and a second conductive portion formed on the opposite end of the second penetrating hole. The first conductor is connecting the first and second circuits. The second conductor is connecting the first and second conductive portions. The first circuit has the thickness which is set greater than the thickness of the first conductive portion.

18 Claims, 16 Drawing Sheets

Thickness (t1) (um) of first conductive circuit (24a) > Thickness (t2) (um) of first conductive portion 28
Thickness (t3) (um) of second conductive circuit (24b) > Thickness (t4) (um) of second conductive portion 34

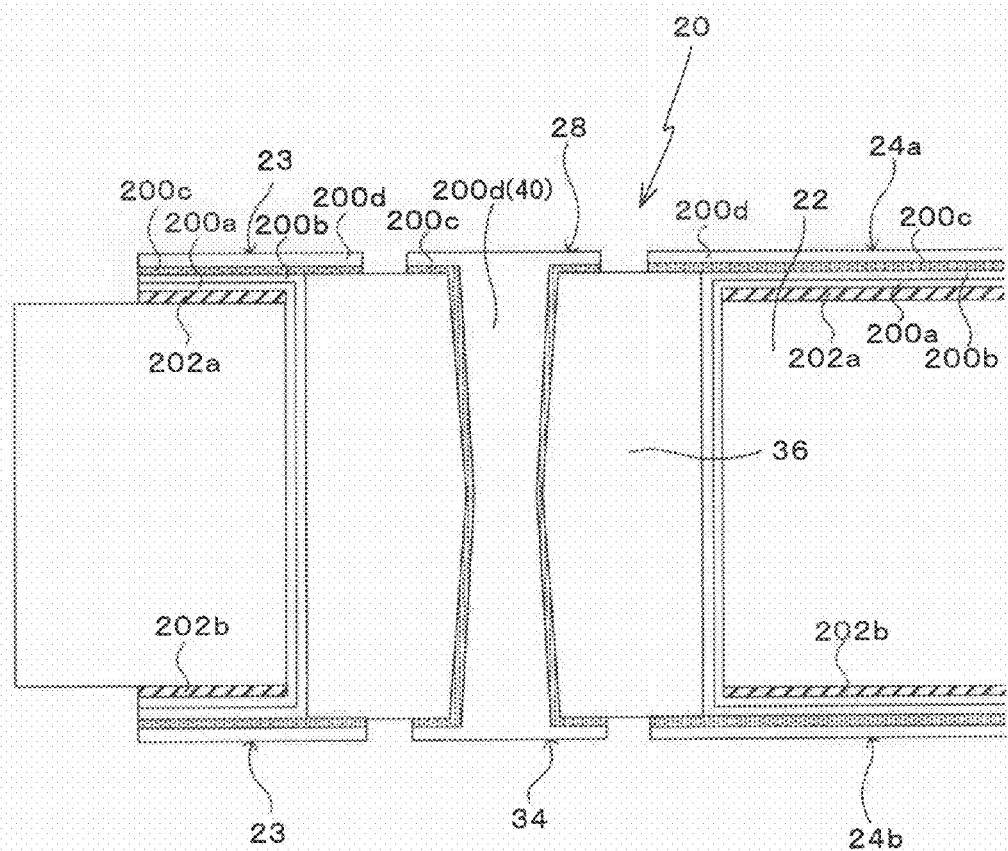

WIRING BOARD AND METHOD FOR MANUFACTURING THE SAME

CROSS-REFERENCE TO RELATED APPLICATIONS

The present application claims the benefits of priority to U.S. Application No. 61/308,591, filed Feb. 26, 2010. The contents of that application are incorporated herein by reference in their entirety.

BACKGROUND OF THE INVENTION

1. Field of the Invention

The present invention relates to a wiring board and its manufacturing method.

2. Discussion of the Background

In recent years, as various semiconductor elements have become highly integrated and have even more pins, printed wiring boards that have finer wiring are being required. Accordingly, demand is increasing for multilayer printed wiring boards having finer conductive wirings on both their inside and outside. In addition, since analog signals and digital-pulse signals are used in electronic devices in which printed wiring boards are used, arrangements similar to those for alternating-current signals are required. In such a multilayer printed wiring board, when alternating-current signals flow, impedance (inductance) rises in a through-hole conductor to be used as a power-supply line to a CPU. Accordingly, if a sudden demand for power comes from the CPU, the supply of voltage may be delayed and thus may pose an obstacle to the operation of the CPU.

In Japanese Laid-Open Patent Publication No. 2002-204075, a printed wiring board is described where through holes with a coaxial structure are used. In the present application, the contents of Japanese Laid-Open Patent Application No. 2002-204075 are incorporated herein by reference in their entirety.

SUMMARY OF THE INVENTION

According to one aspect of the present invention, a wiring board includes a substrate having a first surface and a second surface on the opposite side of the first surface, the substrate having a first penetrating hole penetrating through the substrate between the first surface and the second surface, a first through-hole conductor formed on the inner wall of the first penetrating hole, a filler filled inside the first through-hole conductor and forming a second penetrating hole, and a second through-hole conductor formed in the second penetrating hole, a first conductive circuit formed on the first surface of the substrate, a second conductive circuit formed on the second surface of the substrate, a first conductive portion formed on one end of the second penetrating hole, and a second conductive portion formed on the opposite end of the second penetrating hole. The first through-hole conductor is connecting the first conductive circuit and the second conductive circuit. The second through-hole conductor is connecting the first conductive portion and the second conductive portion. The first conductive circuit has the thickness which is set greater than the thickness of the first conductive portion.

According to another aspect of the present invention, a method for manufacturing a wiring board includes forming a first penetrating hole in a substrate such that the first through-hole penetrates through the substrate between a first surface of the substrate and a second surface of the substrate on the opposite side of the first surface, forming a first through-hole conductor on the inner wall of the first penetrating hole, forming a first conductive circuit on the first surface of the substrate, forming a second conductive circuit on the second surface of the substrate such that the second conductive circuit is connected to the first conductive circuit by the first through-hole conductor, filling a filler in the first through-hole conductor, forming a second penetrating hole in the filler, forming a second through-hole conductor in the second penetrating hole, forming a first conductive portion on one end of the second penetrating hole, and forming a second conductive portion on the opposite end of the second penetrating hole such that the second conductive portion is connected to the first conductive portion by the second through-hole conductor. The first and second conductive circuits have the thicknesses which are formed to be thicker than the thicknesses of the first and second conductive portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a magnified cross-sectional view schematically showing a through hole in a core substrate;

DETAILED DESCRIPTION OF THE EMBODIMENTS

Figure 1:
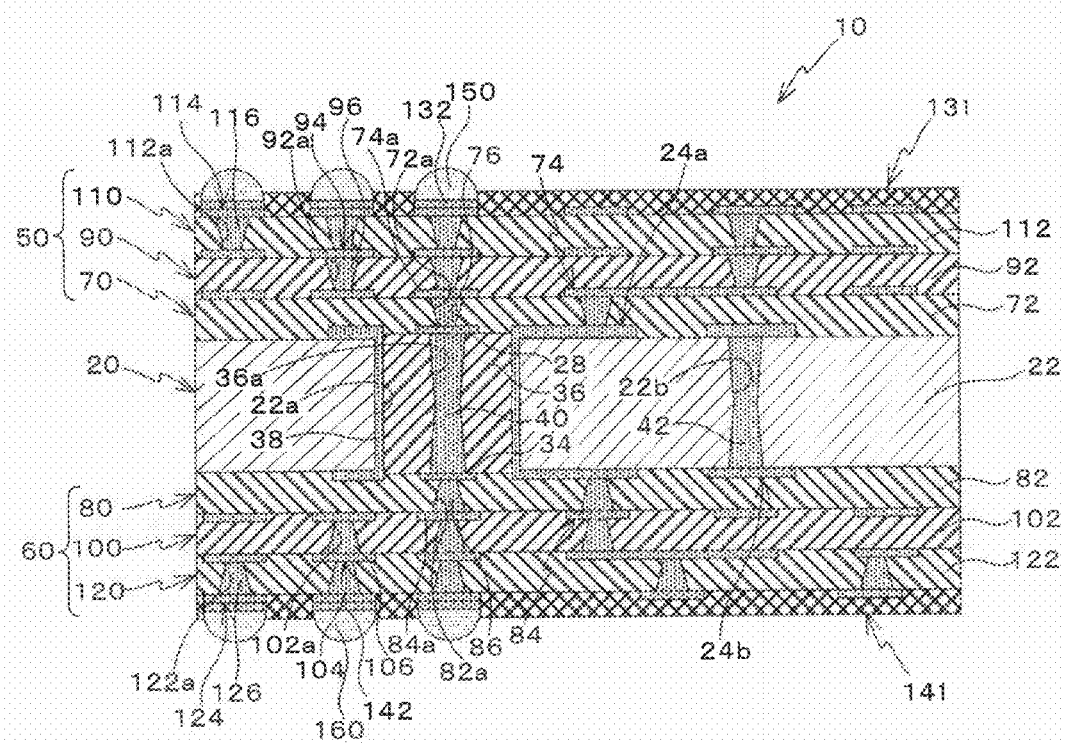
FIG. 1 is a cross-sectional view showing a wiring board according to an embodiment of the present invention.

The embodiments will now be described with reference to the accompanying drawings, wherein like reference numerals designate corresponding or identical elements throughout the various drawings.

Wiring board 10 according to the present embodiment is a printed wiring board. As shown in FIG. 1, wiring board 10 has core substrate 20, built-up layers (50, 60), solder-resist layers (131, 141) and external connection terminals (150, 160) made of solder.

Core substrate 20 has insulative substrate 22, first conductive circuit (24a) and second conductive circuit (24b) made of copper, for example, outer through-hole conductor 38, inner through-hole conductor 40 and filler 36. First conductive circuit (24a) is formed on the first surface of core substrate 20 (insulative substrate 22), and second conductive circuit (24b) is formed on the second surface of core substrate 20 (insulative substrate 22).

Insulative substrate 22 is made of epoxy resin, for example. Epoxy resin is preferred to contain reinforcing material such as glass fiber (glass fabric or glass non-woven fabric, for example) or aramid fiber (aramid non-woven fabric, for example) impregnated with resin. Any type of material may be used for insulative substrate 22. The reinforcing material has a smaller thermal expansion coefficient than the primary material (epoxy resin in the present embodiment).

In insulative substrate 22, first penetrating hole (22a) is formed to penetrate from the first surface of core substrate 20 through the second surface. The opening shape of first penetrating hole (22a) is circular, for example.

On the inner wall of first penetrating hole (22a), ring-shaped outer through-hole conductor 38 is formed by plating. Here, plating indicates depositing a layered conductor (such as metal) on a surface of metal or resin as well as such a deposited conductive layer (such as a metal layer). Also, plating includes wet plating such as electrolytic plating and electroless plating along with dry plating such as PVD (Physical Vapor Deposition) and CVD (Chemical Vapor Deposition). From a viewpoint of lowering electrical resistance, outer through-hole conductor 38 is preferred to be made of copper plating.

First conductive circuit (24a) and second conductive circuit (24b) are positioned to face each other by sandwiching insulative substrate 22. Then, first conductive circuit (24a) and second conductive circuit (24b) are connected by outer through-hole conductor 38.

Filler 36 is filled in outer through-hole conductor 38. Filler 36 is made of thermosetting resin such as epoxy resin. As for the preferred resin to be used for filler 36, at least one kind may be selected from among bisphenol-type epoxy resins and novolac-type epoxy resins. In filler 36, second penetrating hole (36a) is formed to penetrate from the first surface of core substrate 20 through the second surface. The opening shape of second penetrating hole (36a) is circular, for example.

Figure 2:
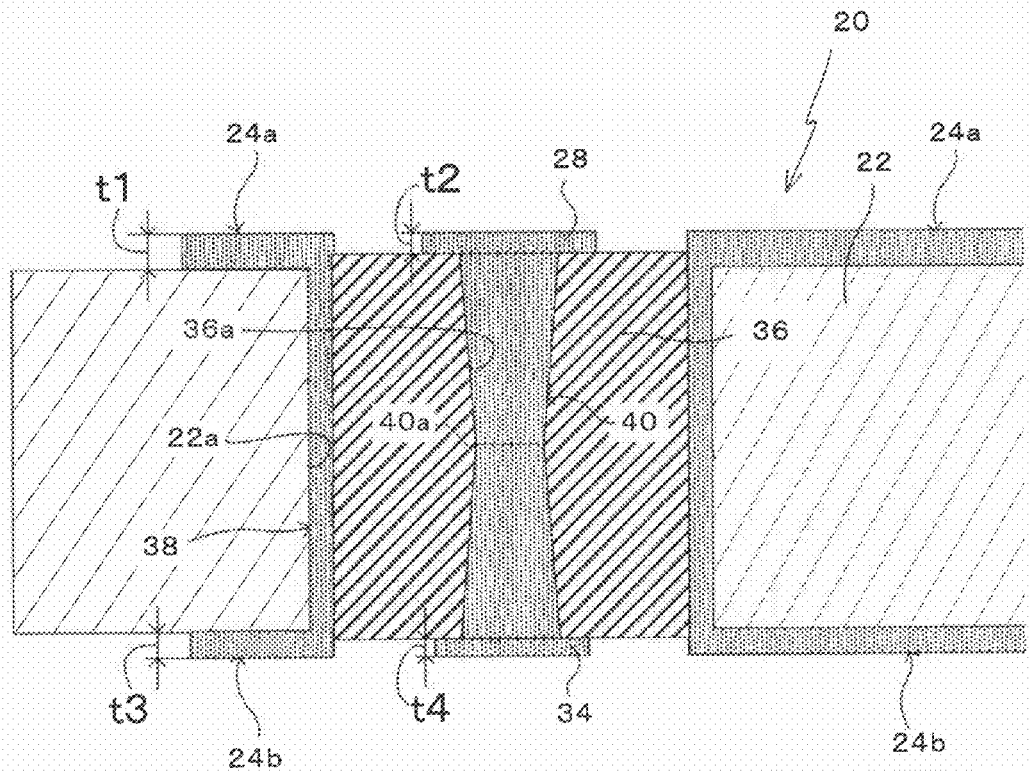
FIG. 2 is a magnified cross-sectional view showing a through hole in a core substrate.

Inner through-hole conductor 40 is formed with the plating filled in second penetrating hole (36a). As shown in FIG. 2, narrowed portion (40a) (a portion having the smallest diameter) is formed in inner through-hole conductor 40 at substantially the halfway point in the thickness of insulative substrate 22. The diameter of the central portion is set to be smaller than the diameter of the upper and lower portions. Such upper and lower portions are preferred to be formed substantially symmetrical with narrowed portion (40a) as a divide. However, inner through-hole conductor 40 is not limited to such, and it may be formed to be asymmetrical with narrowed portion (40a) as a divide. Here, the central axis of inner through-hole conductor 40 overlaps the central axis of first penetrating hole (22a) (filler 36). However, inner through-hole conductor 40 is not limited to such, and it may be formed in a position shifted in a direction parallel to the surface of insulative substrate 22. Here, from a viewpoint of lowering electrical resistance, inner through-hole conductor 40 is preferred to be made of copper plating.

Lid-shaped first conductive portion 28 and second conductive portion 34 are formed so as to cover the upper and lower surfaces of inner through-hole conductor 40. Namely, conductive portions (28, 34) work as lands. First conductive portion 28 and second conductive portion 34 are made of plating. First conductive portion 28 and second conductive portion 34 are positioned to face each other by sandwiching filler 36. First conductive portion 28 and second conductive portion 34 are positioned on substantially the same planes as first conductive circuit (24a) and second conductive circuit (24b) respectively (first surface and second surface of core substrate 20). The surface of first conductive portion 28 is positioned on substantially the same plane as the surface of first conductive circuit (24a), and the surface of second conductive portion 34 is positioned on substantially the same plane as the surface of second conductive circuit (24b).

First conductive portion 28 and second conductive portion 34 are connected by inner through-hole conductor 40. As described so far, since first conductive portion 28 and second conductive portion 34 formed on the upper and lower surfaces of core substrate 20 are connected by inner through-hole conductor 40, the aspect ratio (depth/diameter) of first penetrating hole (22a) is set small, compared with those in printed wiring boards described earlier in the background art. Accordingly, when inner through-hole conductor 40 is formed with plating, filling results are improved. Namely, defects such as voids does not occur in inner through-hole conductor 40 and reliability is enhanced in the coaxial through-hole conductors, leading to higher reliability of the wiring board. If such inner through-hole conductor 40 is used as a power-supply through-hole conductor to be connected to the power-supply line to a CPU, electrical resistance is suppressed from rising and variations in the voltage supplied for the CPU are minimized.

In the present embodiment, a coaxial through-hole structure is formed with outer through-hole conductor 38 and inner through-hole conductor 40 as shown in FIG. 1.

As shown in FIG. 2, first conductive circuit (24a) and second conductive circuit (24b) are each formed with land portion 23 formed at an open end of outer through-hole conductor 38 along with a wiring portion extended from land portion 23.

The electrolytic plated films as first conductive portion 28 and second conductive portion 34 formed on the upper and lower surfaces of filler 36 have a single-layer structure only with electrolytic plated film 208. By contrast, the electrolytic plated films, which are formed as first conductive circuit (24a) (land portion 23) and second conductive circuit (24b) (land portion 23) formed on the substrate surfaces excluding the top surfaces of filler 36, have a double-layer structure with electrolytic plated film 206 and electrolytic plated film 208. Furthermore, copper foils (202a, 202b) contribute to the thicknesses of first conductive circuit (24a) (land portion 23) and second conductive circuit (24b) (land portion 23) (see FIGS. 5G, 5H).

Accordingly, in wiring board 10 of the present embodiment, as shown in FIG. 2, thickness (t1) (um) of first conductive circuit (24a) (land portion 23) is set greater than thickness (t2) (um) of first conductive portion 28 (land portion 23). Also, thickness (t3) (um) of second conductive circuit (24b) (land portion 23) is set greater than thickness (t4) (um) of second conductive portion 34 (land portion 23).

As shown in FIG. 4, on the substrate surface excluding the top surface of filler 36, first conductive circuit (24a) has a multilayer structure with copper foil (202a) on the insulative substrate along with electroless plated film (200a), electrolytic plated film (200b), electroless plated film (200c) and electrolytic plated film (200d) formed in that order from copper foil (202a) upward. Inner through-hole conductor 40 is formed in the same process using the same material as later-described conductive layers.

In addition, on the top surface of filler 36, first conductive portion 28 is formed with electroless plated film (200c) and its upper layer, electrolytic plated film (200d).

Core substrate 20 has the same structures as above in second conductive circuit (24b) and second conductive portion 34. As described, by setting first and second conductive circuits (24a, 24b) thicker than first and second conductive portions (28, 34) respectively, rigidity is ensured in core substrate 20. As a result, for example, even when a thermal history is produced while forming external connection terminals, warping is effectively suppressed from occurring in core substrate 20.

In particular, first conductive circuit (24a) contains copper foil (202a) formed on insulative substrate 22 and first electroless plated film (200a) formed on such copper foil (202a), as shown in FIG. 4. In addition, first conductive circuit (24a) contains electrolytic plated film 206 formed on the first electroless plated film, second electroless plated film (200c) formed on electrolytic plated film 206, and second electrolytic plated film (200d) formed on the second electroless plated film.

On the other hand, second conductive circuit (24b) contains copper foil (202b) formed on insulative substrate 22 and first electroless plated film (200a) formed on such copper foil (202b). In addition, second conductive circuit (24b) contains electrolytic plated film 206 formed on the first electroless plated film, second electroless plated film (200c) formed on electrolytic plated film 206, and second electrolytic plated film (200d) formed on the second electroless plated film.

Also, the widths of first conductive portion 28 and second conductive portion 34 are each set greater than the width of inner through-hole conductor 40. Moreover, the surface of first conductive circuit (24a) and the surface of first conductive portion 28 are positioned on substantially the same plane; and the surface of second conductive circuit (24b) and the surface of second conductive portion 34 are positioned on substantially the same plane.

As described above, according to wiring board 10 of the present embodiment, the thickness of first conductive circuit (24a) and second conductive circuit (24b) becomes greater. Therefore, rigidity is ensured when multiple built-up layers are formed. As a result, lowered reliability of the wiring board resulting from deformation or warping of the core substrate caused by the thermal history while reflowing bumps is suppressed from occurring.

Figure 3A:
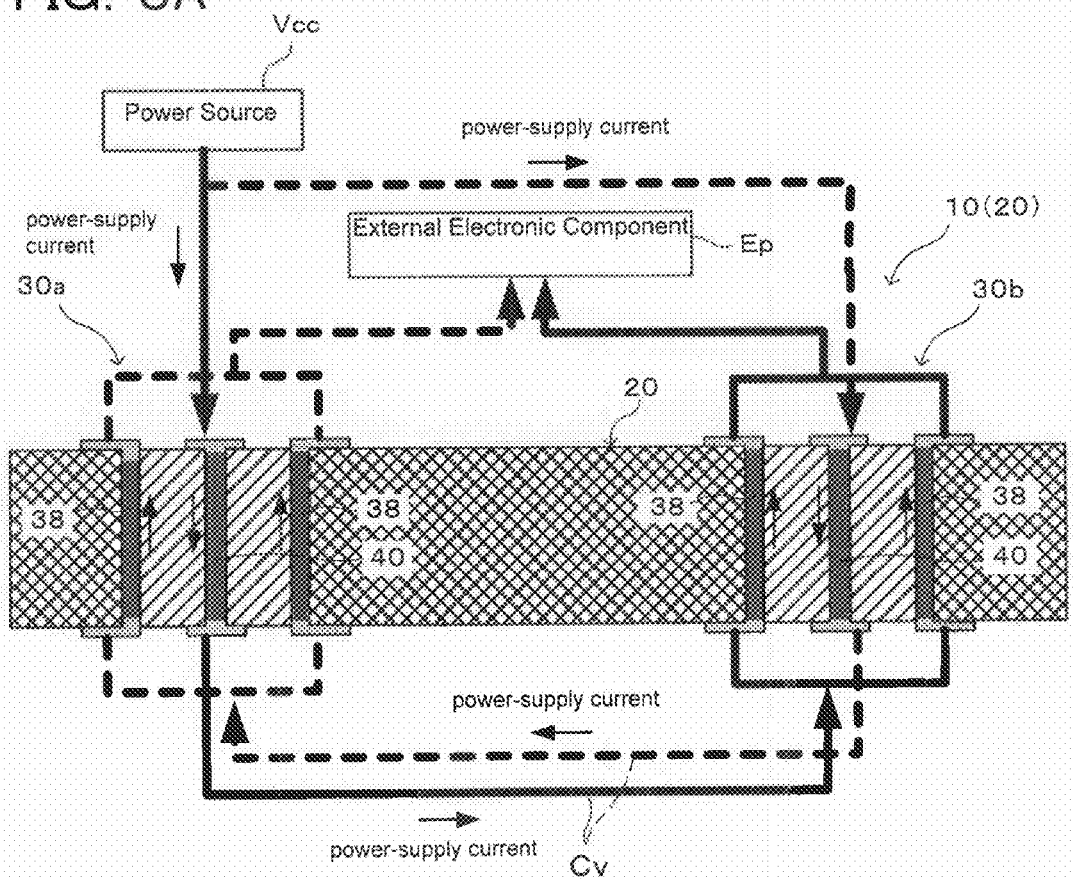
FIG. 3A is a view schematically showing electrical connections between two coaxial through-hole structures.
Figure 3B:
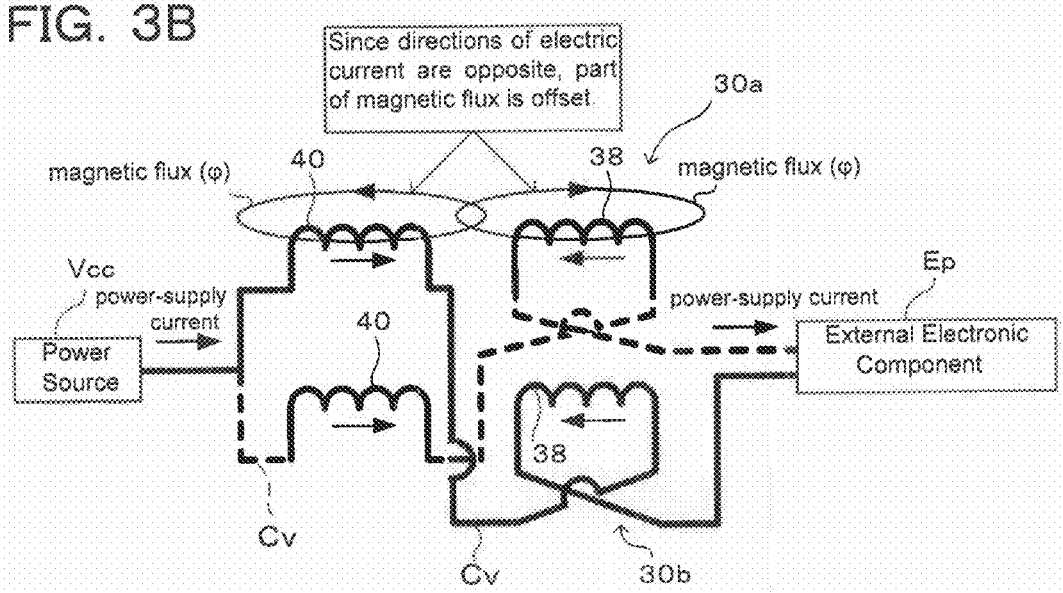
FIG. 3B is another view schematically showing electrical connections between two coaxial through-hole structures.

In the present embodiment, as shown in FIGS. 3A and 3B, first through-hole structure (30a) and second through-hole structure (30b), each formed as a coaxial structure of outer through-hole conductor 38 and inner through-hole conductor 40, are formed in wiring board 10 (core substrate 20). Outer through-hole conductor 38 of first through-hole structure (30a) and inner through-hole conductor 40 of second through-hole structure (30b) are electrically connected. In addition, inner through-hole conductor 40 of first through-hole structure (30a) and outer through-hole conductor 38 of second through-hole structure (30b) are electrically connected. Such first through-hole structure (30a) and second through-hole structure (30b) are used as power-supply through holes. Namely, for example, power source (Vcc) is connected to inner through-hole conductors 40 of first through-hole structure (30a) and second through-hole structure (30b), and outer through-hole conductors 38 of first through-hole structure (30a) and second through-hole structure (30b) are electrically connected to an external electronic component (Ep) such as a CPU (Central Processing Unit) or an MPU (Micro Processing Unit) mounted on wiring board 10. Then, power-supply current is flowed from power-source (Vcc) to transmission lines (Cv) that connect such nodes to supply power to each node. As indicated in FIGS. 3A and 3B, in first through-hole structure (30a) and second through-hole structure (30b), outer through-hole conductor 38 and inner through-hole conductor 40 are set to have equal electrical potential.

In the present embodiment, in first through-hole structure (30a) and second through-hole structure (30b), inductors are formed in outer through-hole conductor 38 and inner through-hole conductor 40 as shown in FIG. 3B. As shown in FIG. 3A, in first through-hole structure (30a) and second through-hole structure (30b), the electric currents flowing through outer through-hole conductor 38 and inner through-hole conductor 40 flow in opposite directions, one in an upward direction when the other is in a downward direction. Thus, part of the magnetic flux ($\phi$) generated in the inductors formed respectively in outer through-hole conductor 38 and inner through-hole conductor 40 are offset. Accordingly, impedance in transmission lines decreases in wiring board 10, and malfunctions and operational delays are suppressed from occurring in a CPU or an MPU. Furthermore, because of such structures, the flexibility of designing transmission lines in wiring board 10 or the flexibility of positioning an electronic component to be mounted on wiring board 10 increases. For example, a VRM (Voltage Regulator Module) for a supply of constant voltage may be positioned near a CPU or an MPU.

In the present embodiment, by positioning a VRM near a CPU, for example, the supply of voltage from a point (VRM) closer to a CPU is achieved without loss. Therefore, the number of chip capacitors to be set in a wiring board for power supply is reduced. In addition, inductors for a VRM are formed by connecting two (multiple) through-hole structures to each other in the present embodiment. Thus, three-dimensional spiral inductors may be formed in the wiring board. As a result, compared with situations in which inductors are formed using conductive circuits on an insulation layer, for example, an efficient use of space is achieved. Accordingly, the wiring board is suppressed from being enlarged.

Furthermore, as previously shown in FIG. 1, core substrate 20 has third through-hole conductor 42 which connects first conductive circuit (24a) and second conductive circuit (24b). Third through-hole conductor 42 is formed by filling plating in third penetrating hole (22b) formed in insulative substrate 22. Third through-hole conductor 42 works as a signal conductor.

Built-up layer 50 is formed on the first surface of core substrate 20, and built-up layer 60 is formed on the second surface of core substrate 20. Built-up layer 50 is formed with first layer 70, second layer 90 and third layer 110 in that order from the core-substrate 20 side. Built-up layer 60 is formed with first layer 80, second layer 100 and third layer 120 in that order from the core-substrate 20 side. First layer 70 has insulation layer 72 and wiring layer 74 which is formed on the upper-side surface of insulation layer 72. First layer 80 has insulation layer 82 and wiring layer 84 which is formed on the lower-side surface of insulation layer 82.

Insulation layer 72 is formed on the first surface of core substrate 20 as shown in FIG. 1. Insulation layer 82 is formed on the second surface of core substrate 20.

Via hole (72a) is formed in insulation layer 72. Also, via hole (82a) is formed in insulation layer 82. Then, plating is filled in via holes (72a, 82a), forming via conductors (76, 86) respectively.

Insulation layers (72, 82) are made of cured prepreg, for example. As for prepreg, the following is used: base material such as glass fiber or aramid fiber impregnated with resin such as epoxy resin, polyester resin, bismaleimide-triazine resin (BT resin), imide resin (polyimide), phenol resin or allyl polyphenylene ether resin (A-PPE resin). Instead of prepreg, liquid- or film-type thermosetting resin or thermoplastic resin, a compound of such resins, or RCF (resin-coated copper foil) may also be used.

In the present embodiment, via conductors (76, 86) are filled vias. However, via conductors (76, 86) are not limited to being such, and they may also be conformal vias.

Wiring layer 74 includes conductor (74a) positioned over inner through-hole conductor 40. Conductor (74a) is connected to first conductive portion 28 by via conductor 76.

Wiring layer 84 includes conductor (84a) positioned below inner through-hole conductor 40. Conductor (84a) is connected to second conductive portion 34 by via conductor 86.

In the present embodiment, via conductor 76 is formed to be positioned substantially along the central axis of inner through-hole conductor 40. However, via conductor 76 is not limited to being positioned in such a manner, and it may be positioned by shifting away from inner through-hole conductor 40 in a direction parallel to the surface of insulative substrate 22.

As shown in FIG. 1, second layer 90 has insulation layer 92 and wiring layer 94 which is formed on the upper-side surface of insulation layer 92. Second layer 100 has insulation layer 102 and wiring layer 104 which is formed on the lower-side surface of insulation layer 102. Also, third layer 110 has insulation layer 112 and wiring layer 114 which is formed on the upper-side surface of insulation layer 112, and third layer 120 has insulation layer 122 and wiring layer 124 which is formed on the lower-side surface of insulation layer 122.

Via holes (92a, 102a) are formed in their respective insulation layers (92, 102). Plating is filled in via holes (92a, 102a), forming via conductors (96, 106) which are filled vias.

In addition, on the upper-side surface of insulation layer 92 and on the lower-side surface of insulation layer 102, wiring layer 94 and wiring layer 104 are formed respectively. Wiring layer 74 and wiring layer 94 are connected by via conductor 96, and wiring layer 84 and wiring layer 104 are connected by via conductor 106.

Also, on the upper-side surface of insulation layer 92 and on the lower-side surface of insulation layer 102, insulation layer 112 and insulation layer 122 are formed respectively. Then, wiring layer 94 and wiring layer 114 are connected by via conductor 116 formed in via hole (112a) in insulation layer 112. Also, wiring layer 104 and wiring layer 124 are connected by via conductor 126 formed in via hole (122a) in insulation layer 122.

Then, solder-resist layer 131 is formed on the upper-side surface of insulation layer 112, and solder-resist layer 141 is formed on the lower-side surface of insulation layer 122. Solder-resist layers (131, 141) are made of, for example, photosensitive resin using acrylic epoxy resin, thermosetting resin primarily containing epoxy resin, ultraviolet setting resin or the like.

In solder-resist layers (131, 141), openings partly exposing wiring layer 114 and openings partly exposing wiring layer 124 are formed respectively. Such portions of wiring layers (114, 124) are used for solder pads. Solder connection layers (132, 142) are respectively formed on solder pads to enhance solderability. Then, external connection terminals (150, 160) are arranged on solder connection layers (132, 142). External connection terminals (150, 160) are used for electrical connection with other wiring boards and electronic components. Moreover, electronic components such as a VRM (Voltage Regulator Module) are mounted on wiring board 10 to supply constant voltage for a CPU or an MPU if required.

Next, a method for manufacturing wiring board 10 is described with reference to FIGS. 5-8.

Forming Core Substrate 20

Figure 5A:
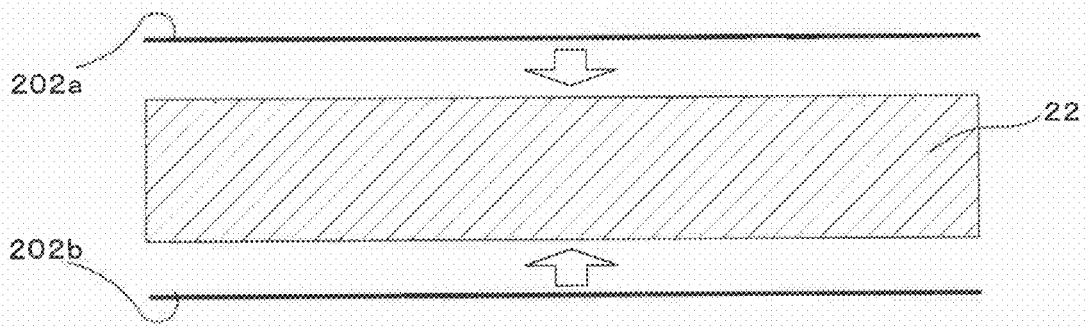
FIG. 5A is a view showing a step for forming a core substrate.

First, copper foils (202a, 202b) are placed on the first surface and second surface of insulative substrate 22 as shown in FIG. 5A, and copper-clad laminate 200 is formed by pressing them.

Figure 5B:
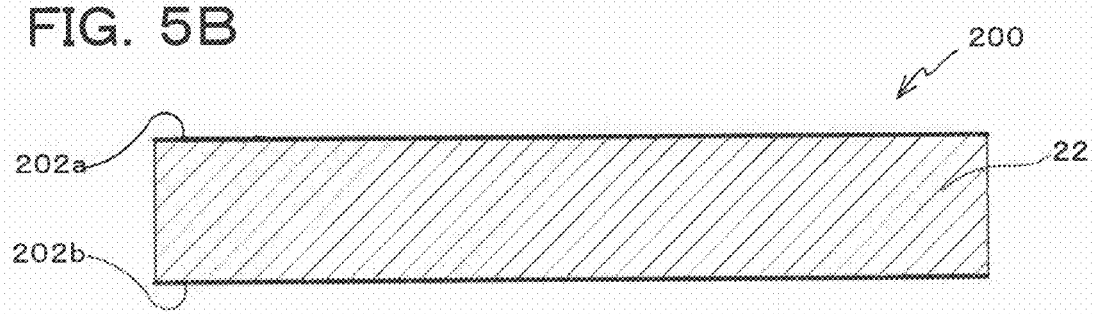
FIG. 5B is subsequent to FIG. 5A, a view showing a step for forming a core substrate.
Figure 5C:
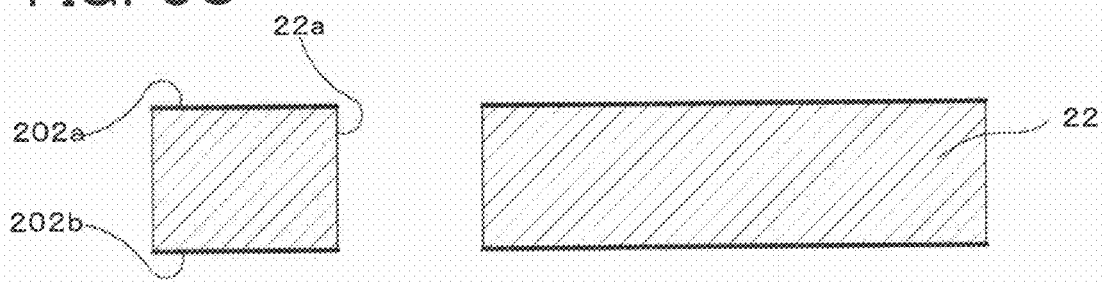
FIG. 5C is subsequent to FIG. 5B, a view showing a step for forming a core substrate.

Accordingly, as shown in FIG. 5B, copper-clad laminate 200 is obtained, having insulative substrate 22, copper foil (202a) formed on the first surface of insulative substrate 22 and copper foil (202b) formed on the second surface of insulative substrate 22.

Next, first penetrating hole (22a) is bored in copper-clad laminate 200 by a known boring method using a drill, for example. The opening shape of first penetrating hole (22a) is circular here. However, it is not limited to being such and may be oval, for example.

Then, by performing electroless plating using a catalyst such as palladium, electroless plated films are performed on the surfaces of copper-clad laminate 200 including the inner wall of first penetrating hole (22a).

The electroless plated films are made of copper, for example. However, the material for electroless plated film is not limited to copper, and metals such as nickel, titanium and chrome may also be used. In addition, to form metal films, methods such as PVD (Physical Vapor Deposition) and CVD (Chemical Vapor Deposition) may also be used instead of electroless plating.

Figure 5D:
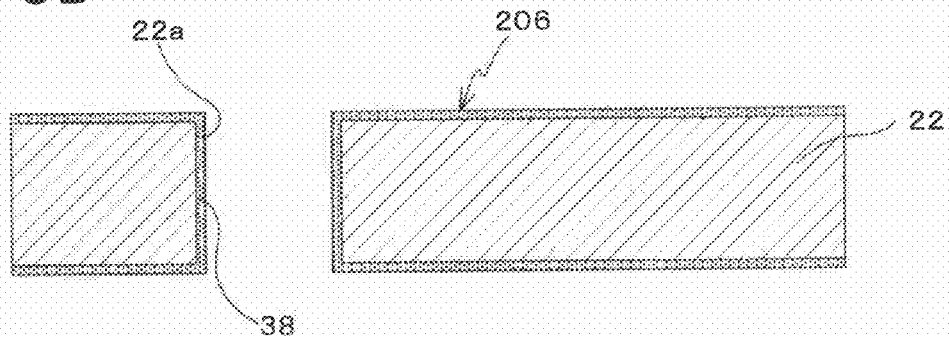
FIG. 5D is subsequent to FIG. 5C, a view showing a step for forming a core substrate.

Next, electrolytic plating is performed to form electrolytic plated films 206 made of copper, for example, using the electroless plated films as seed layers, as shown in FIG. 5D. The material for electrolytic plated films 206 is not limited to copper, and nickel, titanium, chrome or the like may also be used.

By the above electroless plating and electrolytic plating, outer through-hole conductor 38 is formed on the inner wall of first penetrating hole (22a) as shown in FIG. 5D.

Figure 5E:
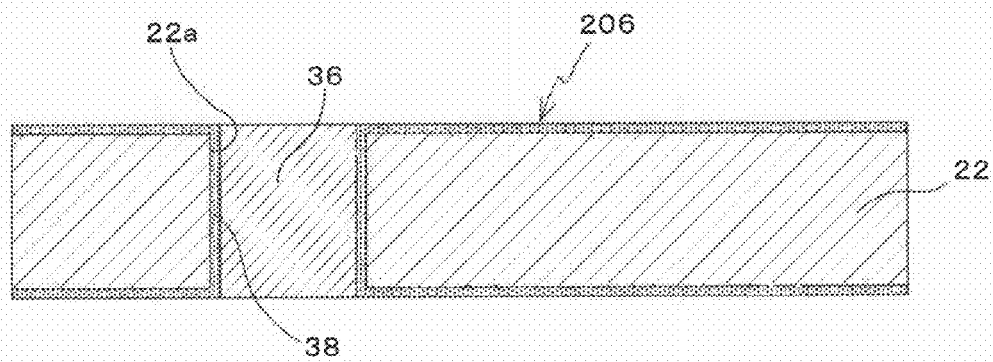
FIG. 5E is subsequent to FIG. 5D, a view showing a step for forming a core substrate.

Next, resin filling material containing thermosetting resin such as epoxy resin and inorganic particles such as silica is filled in outer through-hole conductor 38 as shown in FIG. 5E. Then, the filling material is dried and semi-cured. As for a filling method, known methods such as screen printing may be used. Next, the substrate surface is leveled by soft etching, if required. After that, the resin filling material filled in the hole is heated and cured. Accordingly filler 36 is formed inside outer through-hole conductor 38.

Figure 5F:
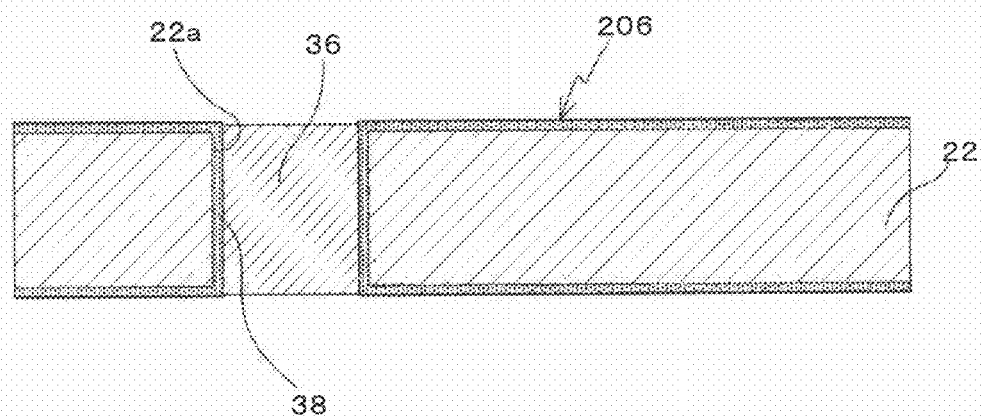
FIG. 5F is subsequent to FIG. 5E, a view showing a step for forming a core substrate.

Next, black-oxide treatment is conducted on the surfaces of electrolytic plated films 206 using an oxidation solution, as shown in FIG. 5F. Accordingly, electrolytic plated films 206 become blackened, and their laser absorption rate during laser processing increases.

Figure 5G:
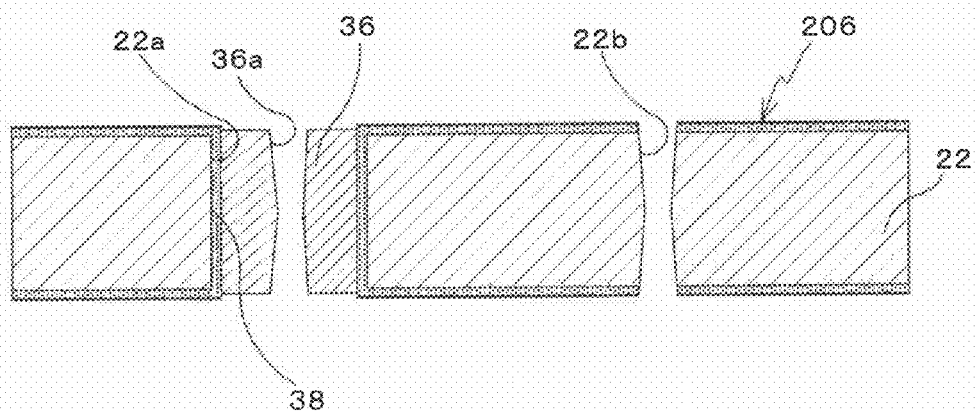
FIG. 5G is subsequent to FIG. 5F, a view showing a step for forming a core substrate.
Figure 5H:
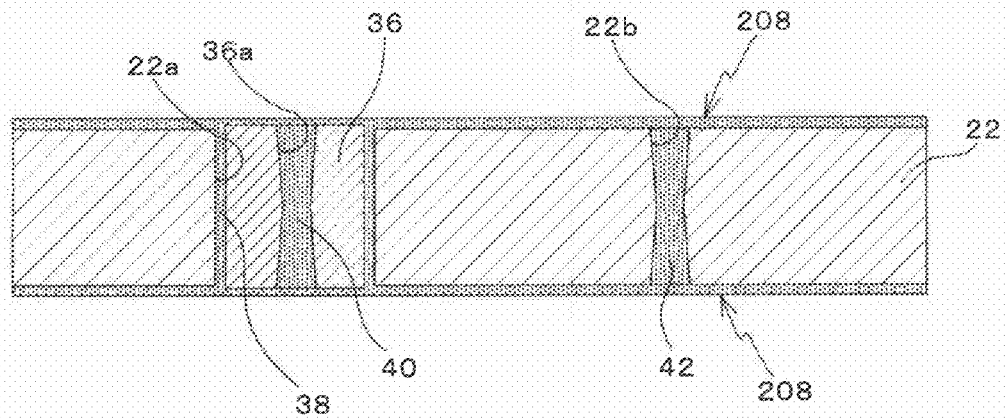
FIG. 5H is subsequent to FIG. 5G, a view showing a step for forming a core substrate.

Next, second penetrating hole (36a) and third penetrating hole (22b) are bored by using a laser as shown in FIG. 5G. Here, a carbon-dioxide gas ($CO_2$) laser, a UV-YAG laser or the like, for example, is irradiated at the first and second surfaces of copper-clad laminate 200. In addition, at this point either a laser having higher energy in the center than on the periphery, or a multi-pulse laser is irradiated. When irradiating a multi-pulse laser, it is preferred that laser diameters be made gradually smaller from the first pulse toward the final pulse. Alternatively, a laser having a higher energy density in the center than on the periphery may be used for the final pulse laser. Here, the number of laser irradiations is not limited specifically. Irradiating a laser may be conducted separately on one surface at a time or on both surfaces simultaneously.

Here, second penetrating hole (36a) is formed to have the diameter in the central portion set smaller than the diameter in the upper-surface and lower-surface openings of filler 36. However, second penetrating hole (36a) is not limited to being formed in such a way. For example, it may be formed to have a diameter in the lower-surface opening of filler 36 set smaller than a diameter in the upper-surface opening. Alternatively, the wall surface of second penetrating hole (36a) may be set perpendicular to the first and second surfaces of insulative substrate 22.

In the present embodiment, the openings of second penetrating hole (36a) and third penetrating hole (22b) are formed to be circular. However, they are not limited to being formed in such a way, and they may be formed to be oval.

In the present embodiment, laser processing is employed to bore second penetrating hole (36a) and third penetrating hole (22b). However, that is not the only method, and drilling may also be employed, for example. In addition, second penetrating hole (36a) is formed so that its central axis overlaps the central axis of first penetrating hole (22a).

Figure 6A:
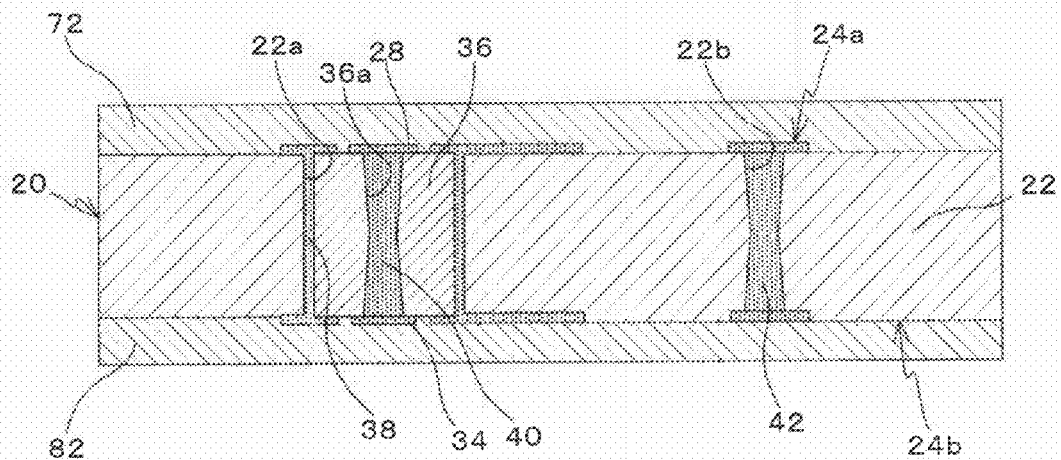
FIG. 6A is a view showing a step for forming built-up layers following the steps for forming a core substrate shown in FIGS. 5A-H.
Figure 6B:
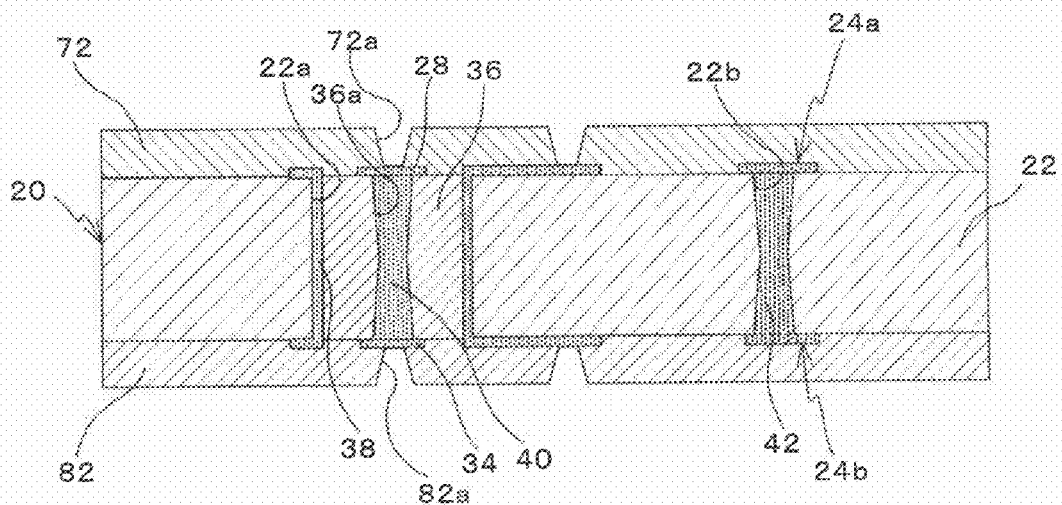
FIG. 6B is subsequent to FIG. 6A, a view showing a step for forming built-up layers.
Figure 6C:
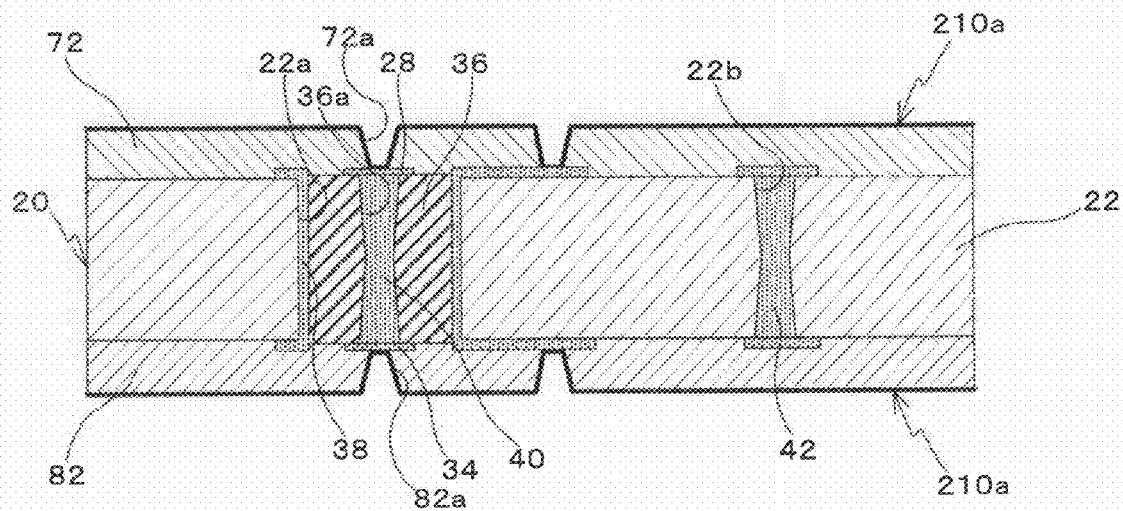
FIG. 6C is subsequent to FIG. 6B, a view showing a step for forming built-up layers.
Figure 6D:
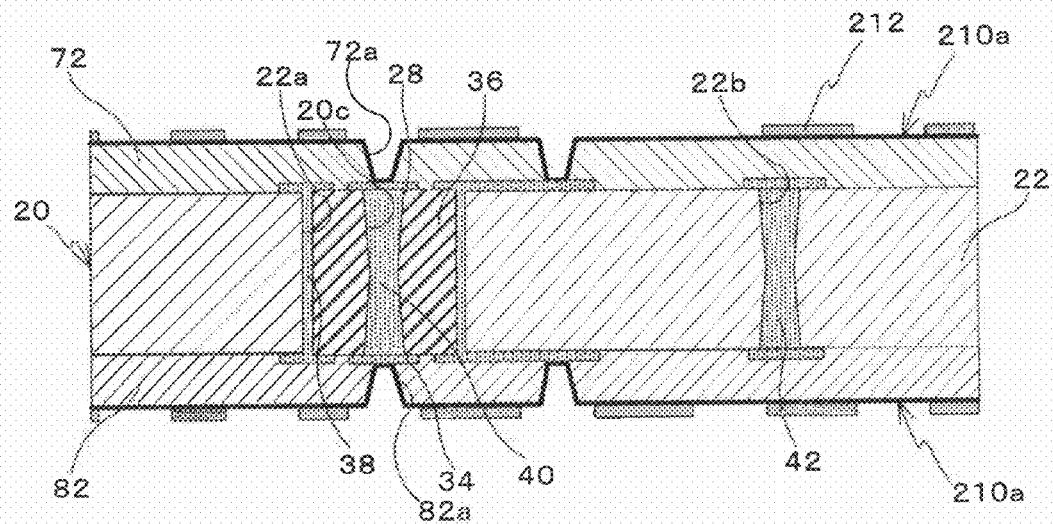
FIG. 6D is subsequent to FIG. 6C, a view showing a step for forming built-up layers.
Figure 6E:
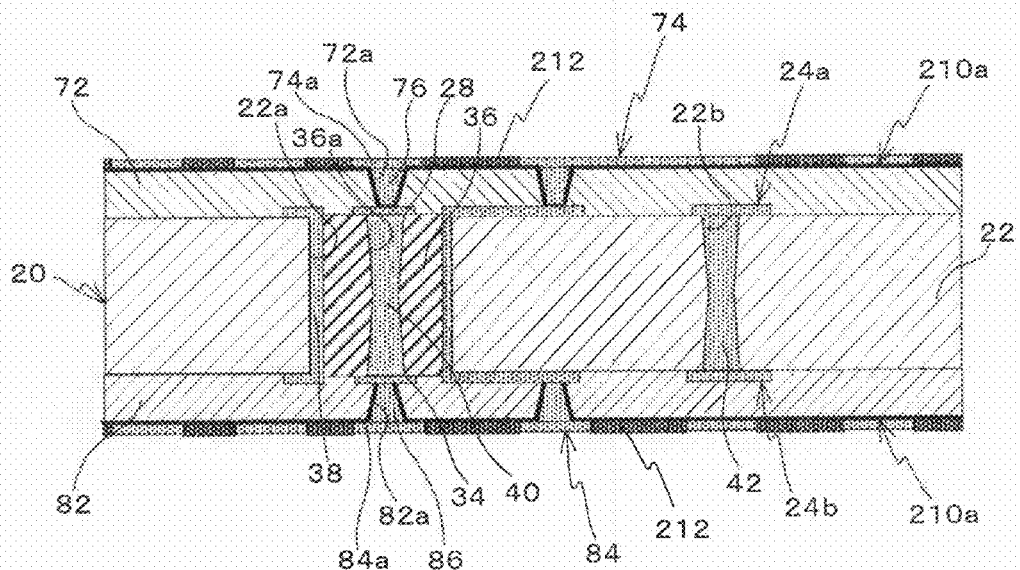
FIG. 6E is subsequent to FIG. 6D, a view showing a step for forming built-up layers.
Figure 6F:
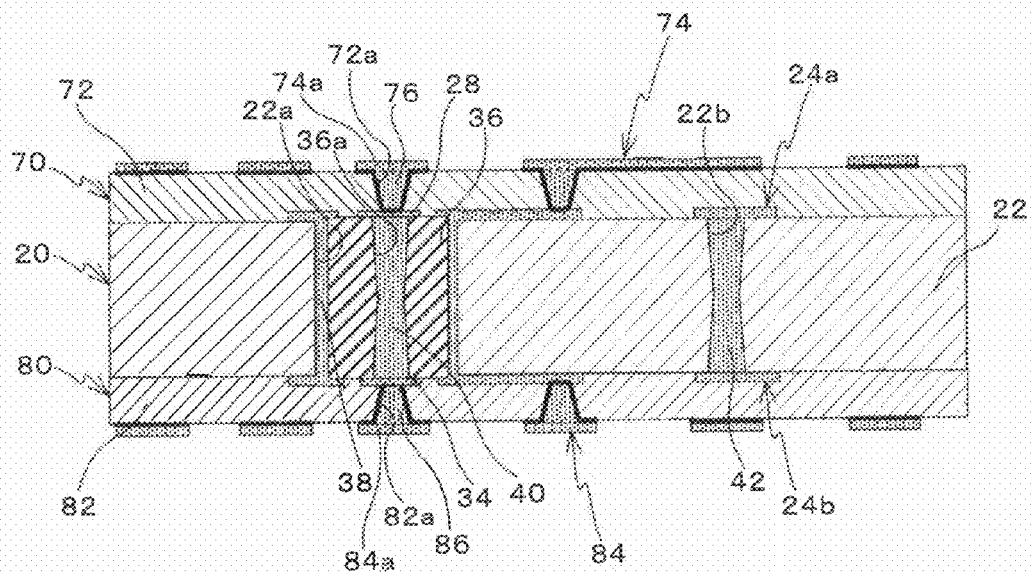
FIG. 6F is subsequent to FIG. 6E, a view showing a step for forming built-up layers.
Figure 6G:
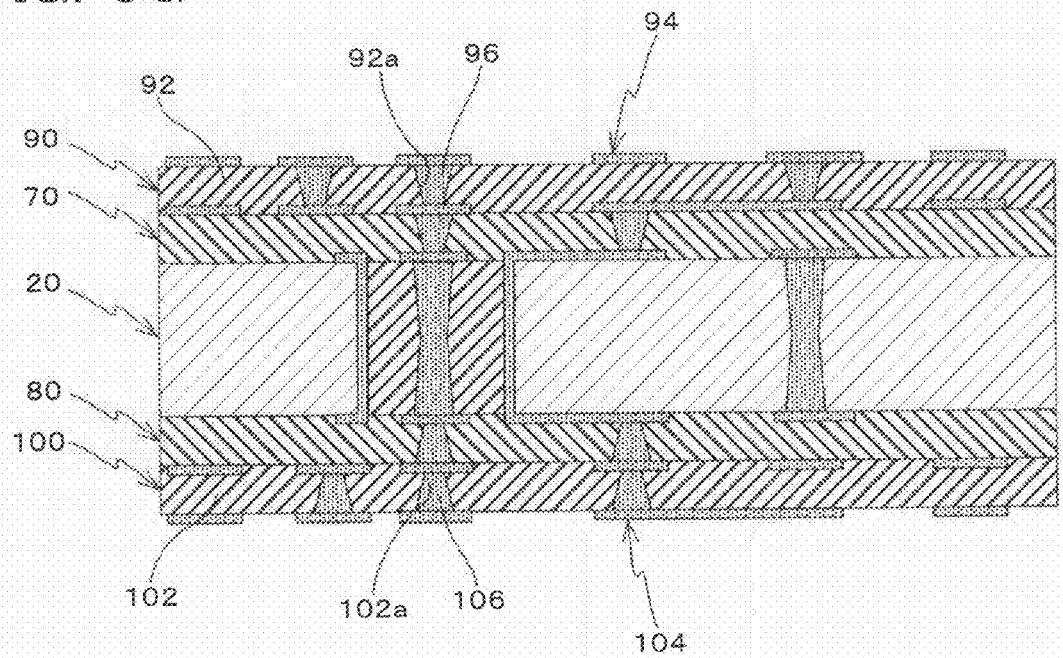
FIG. 6G is subsequent to FIG. 6F, a view showing a step for forming built-up layers.
Figure 6H:
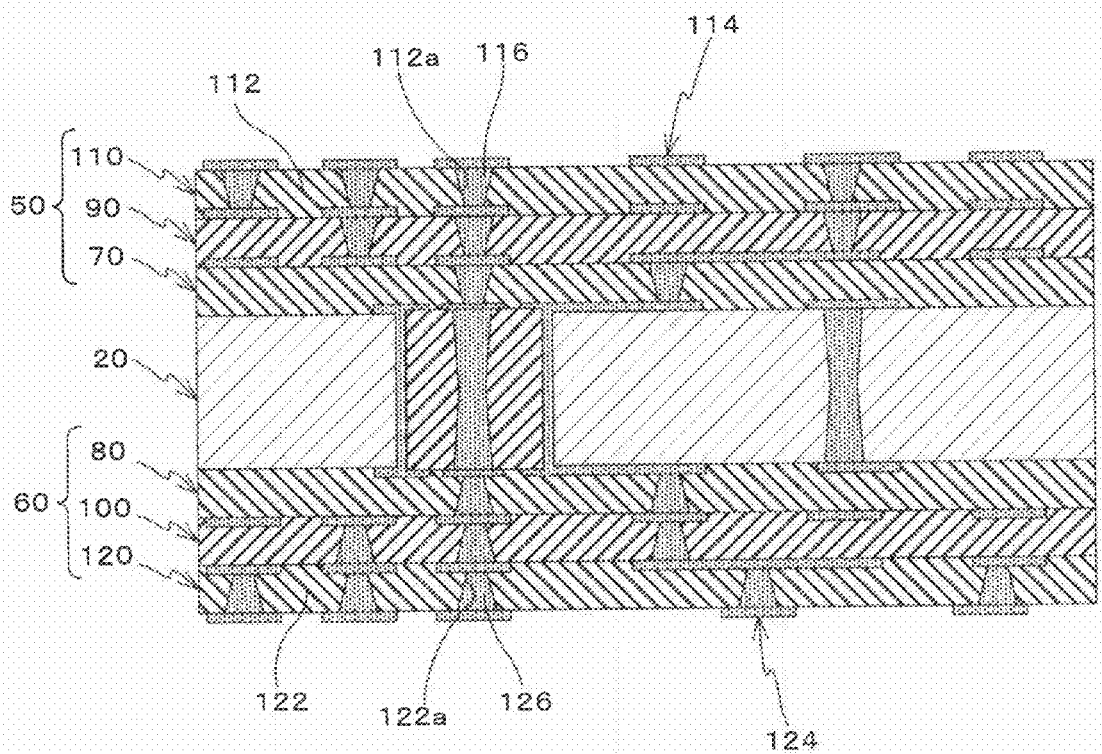
FIG. 6H is subsequent to FIG. 6G, a view showing a step for forming built-up layers.

Next, as shown in FIG. 6H, electroless plating and electrolytic plating are performed to form plated film 208 made of copper, for example, in second penetrating hole (36a) and third penetrating hole (22b) as well as on the substrate surfaces. Here, on the surfaces of filler 36, conductive layers are formed, having a double-layer structure of electroless plated film and electrolytic plated film. Also, on the substrate surfaces excluding top surfaces of filler 36, conductive layers are formed, being made of copper foil (202a), electroless plated films (200a, 200c) and electrolytic plated films (200b, 200d) (see FIGS. 4 and 5H). When the conductive layers are formed, plating is filled in second penetrating hole (36a) and third penetrating hole (22b) at the same time, forming inner through-hole conductor 40 and third through-hole conductor 42 respectively. Here, inner through-hole conductor 40 is formed with copper, but it may also be formed with nickel, conductive paste or the like. As described, inner through-hole conductor 40 and third through-hole conductor 42 are formed using the same procedure and the same material as those of the conductive layers.

Inner through-hole conductor 40 of the present embodiment is formed to have narrowed portion (40a) at the halfway point in the thickness of insulative substrate 22, and the diameter of the central portion is set smaller than the diameter of the top and bottom portions (see FIG. 2). However, inner through-hole conductor 40 is not limited to being formed as above, and its shape may be a truncated cone or a cylinder. Also, the central axis of inner through-hole conductor 40 substantially overlaps the central axis of first penetrating hole (22a).

Figure 5I:
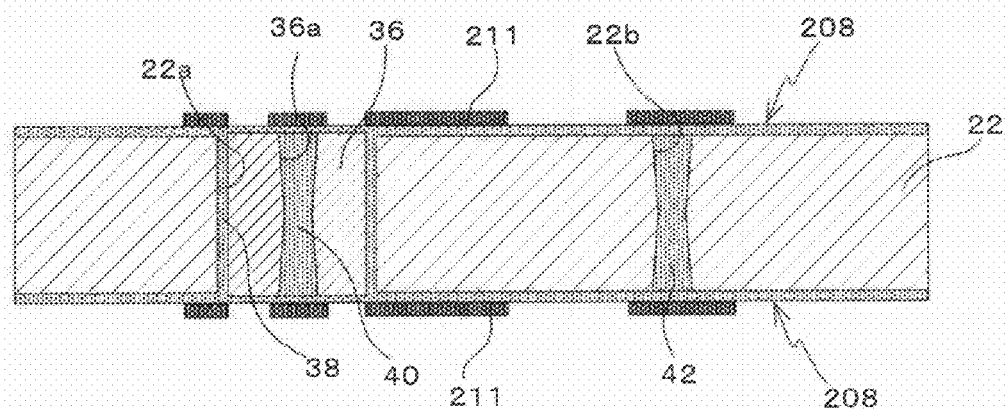
FIG. 5I is subsequent to FIG. 5H, a view showing a step for forming a core substrate.
Figure 5J:
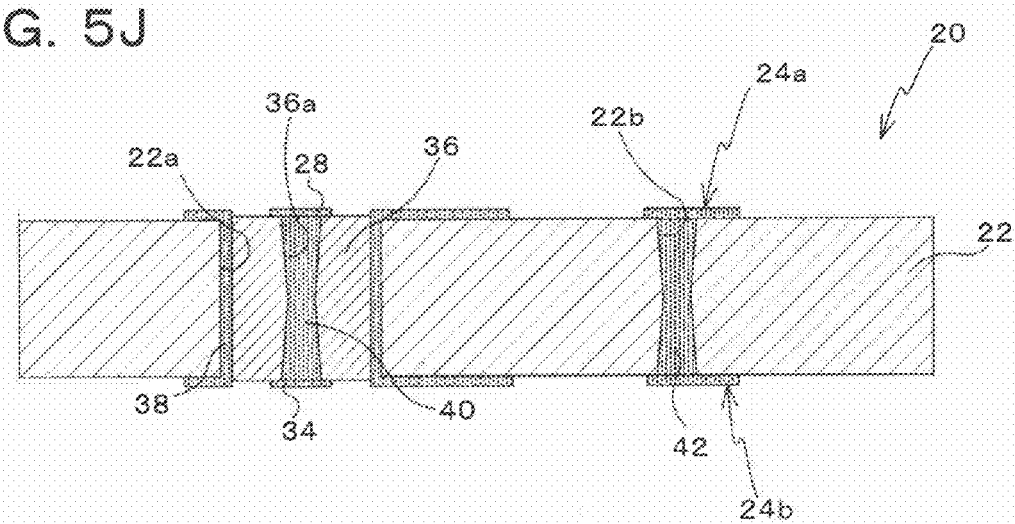
FIG. 5J is subsequent to FIG. 5I, a view showing a step for forming a core substrate.

Next, the conductive layers are patterned by a tenting method, using etching resists 211 as shown in FIG. 5I. Namely, the portions to form patterns and inner through-hole conductors 40 are covered with etching resist 211 having openings to protect such portions, and the electrolytic plated films (conductive layers) exposed through the openings are etched. Accordingly, as shown in FIG. 5J, first conductive portion 28 and first conductive circuit (24a) as well as second conductive portion 34 and second conductive circuit (24b) are formed. As so described, first conductive portion 28 and first conductive circuit (24a) as well as second conductive portion 34 and second conductive circuit (24b) are formed in the same procedure.

Here, in wiring board 10 (core substrate 20), first through-hole structure (30a) and second through-hole structure (30b) are each formed to have the coaxial structure of outer through-hole conductor 38 and inner through-hole conductor 40 (see FIG. 3A).

After that, if required, the surfaces of conductive circuits (24a, 24b) and first and second conductive portions (28, 34) are roughened by etching, for example. By doing so, adhesiveness between first and second conductive circuits (24a, 24b) and insulation layers (72, 82) formed as their upper layers (see FIG. 6A) is enhanced. Through the procedures described so far, core substrate 20 is obtained.

Forming Built-Up Layer 50 and Built-Up Layer 60

Next, as shown in FIG. 6A, by placing film-type thermosetting resin on the first and second surfaces of core substrate 20 and then thermal pressing the films, insulation layers (72, 82) are formed on the first and second surfaces of core substrate 20 respectively. Insulation layers (72, 82) may also be formed by coating liquid-type thermosetting resin using screen printing, curtain coating or the like.

Then, as shown in FIG. 6B, via holes (72a, 82a) are bored in their respective insulation layers (72, 82) by using a laser. Here, when holes are made for via holes (72a, 82a), they may be bored so that their central axes overlap the central axis of inner through-hole conductor 40. Then, to remove smears and the like remaining at the bottom portions of via holes (72a, 82a), desmearing is conducted.

Next, as shown in FIGS. 6C-6F, wiring layer 74 including conductor (74a) and wiring layer 84 including conductor (84a) are formed on their respective insulation layers (72, 82) by using a semi-addictive method.

In particular, the laminate shown in FIG. 6B is immersed in a solution containing a catalyst such as palladium, for example. In doing so, the catalyst is adsorbed on the surfaces of insulation layers (72, 82). Then, as shown in FIG. 6C, the substrate with adsorbed catalyst is immersed in an electroless copper-plating solution to form electroless plated films (210a) on the surfaces of insulation layers (72, 82).

After that, a dry-film-type photosensitive resist is laminated on both surfaces of the laminate. Then, a mask film having a predetermined pattern is adhered to each photosensitive resist, which is then exposed to ultraviolet rays and developed in an alkaline solution. Accordingly, as shown in FIG. 6D, plating-resist layers 212 are formed, where only the regions on which conductors are formed later are opened.

Next, after the laminate is washed with water and dried, electrolytic plating is performed using the electroless plated films as seed layers. Accordingly, as shown in FIG. 6E, wiring layer 74 having conductor (74a) and wiring layer 84 having conductor (84a) are respectively formed in the openings of plating-resist layers 212. During such time, via holes (72a, 82a) are filled with plating and via conductors (76, 86) are formed respectively.

Via conductors (76, 86) are formed so that their central axes overlap the central axis of inner through-hole conductor 40.

Next, plating-resist layers 212 are removed, and the substrate is washed with water and dried. Then, exposed electroless plated films (210a) are removed by etching. Accordingly, as shown in FIG. 6F, a laminate is obtained where first layers (70, 80) are respectively laminated on the upper and lower surfaces of core substrate 20.

Then, the steps shown in FIGS. 6C-6F are repeated and as shown in FIGS. 6G and 6H, second layers (90, 100) and third layers (110, 120) are formed in that order on the upper and lower surfaces of core substrate 20 respectively. Accordingly, a laminate is obtained where built-up layers (50, 60) are laminated on core substrate 20.

During the above procedures, outer through-hole conductor 38 of first through-hole structure (30a) and inner through-hole conductor 40 of second through-hole structure (30b) are electrically connected by the conductors and via conductors. In addition, inner through-hole conductor 40 of first through-hole structure (30a) and outer through-hole conductor 38 of second through-hole structure (30b) are electrically connected by the conductors and via conductors.

Forming Solder-Resist Layer 131 and Solder-Resist Layer 141

Figure 7A:
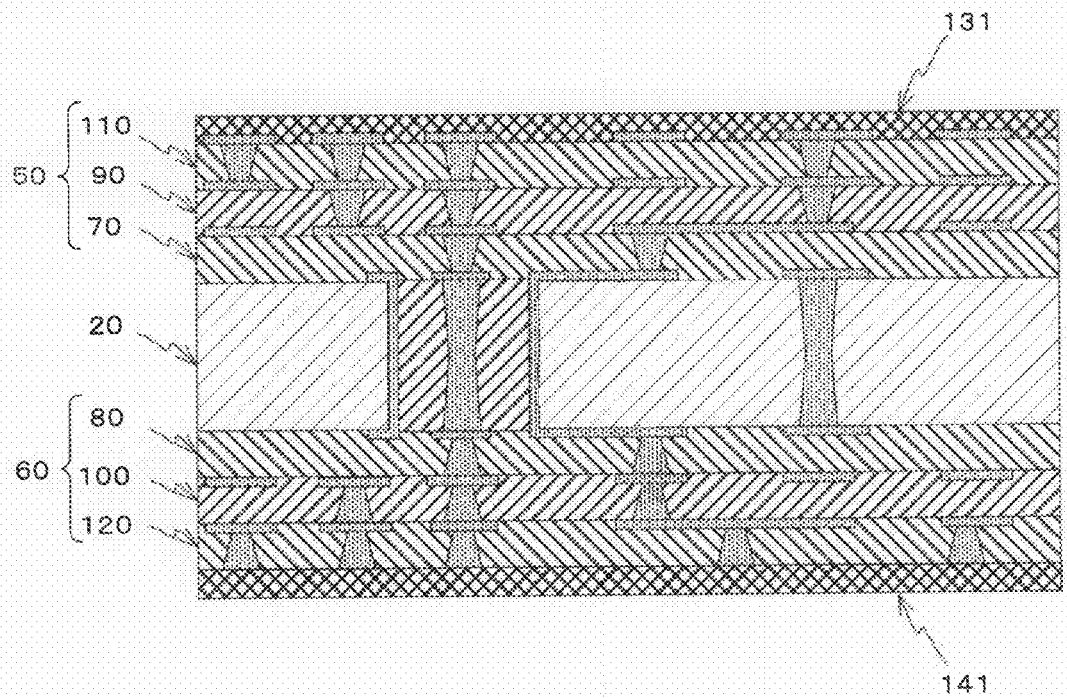
FIG. 7A is a view showing a step for forming solder-resist layers following the steps for forming built-up layers shown in FIGS. 6A-H.

Next, a liquid-type or a dry-film-type photosensitive resist (solder resist) is applied or laminated on both upper and lower surfaces of the laminate shown in FIG. 6H. Accordingly, solder-resist layers (131, 141) are formed on the upper and lower surfaces of the laminate as shown in FIG. 7A.

Figure 7B:
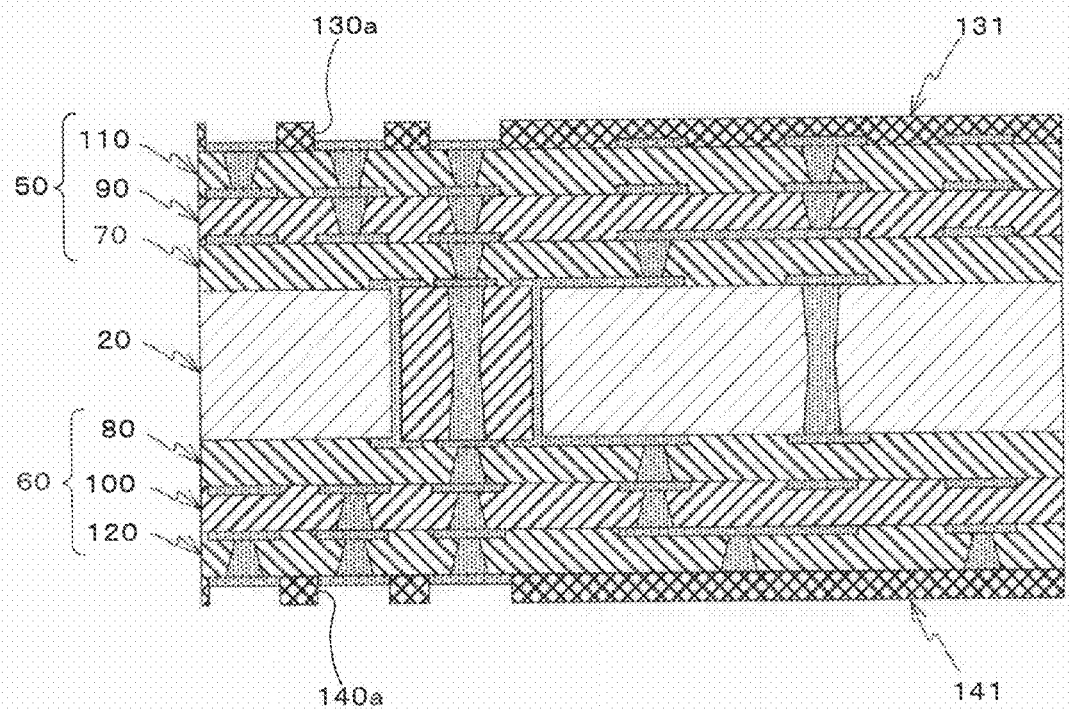
FIG. 7B is subsequent to FIG. 7A, a view showing a step for forming solder-resist layers.

Then, a photomask film with a conductive pattern (opening portions) is adhered on the surfaces of solder-resist layers (131, 141), which are then exposed to ultraviolet rays and developed in an alkaline solution. In doing so, as shown in FIG. 7B, opening portions (130a, 140a) are formed in solder-resist layers (131, 141). Such opening portions (130a, 140a) are made to expose portions which become solder pads in wiring layers (114, 124).

Surface Treatment

Figure 8A:
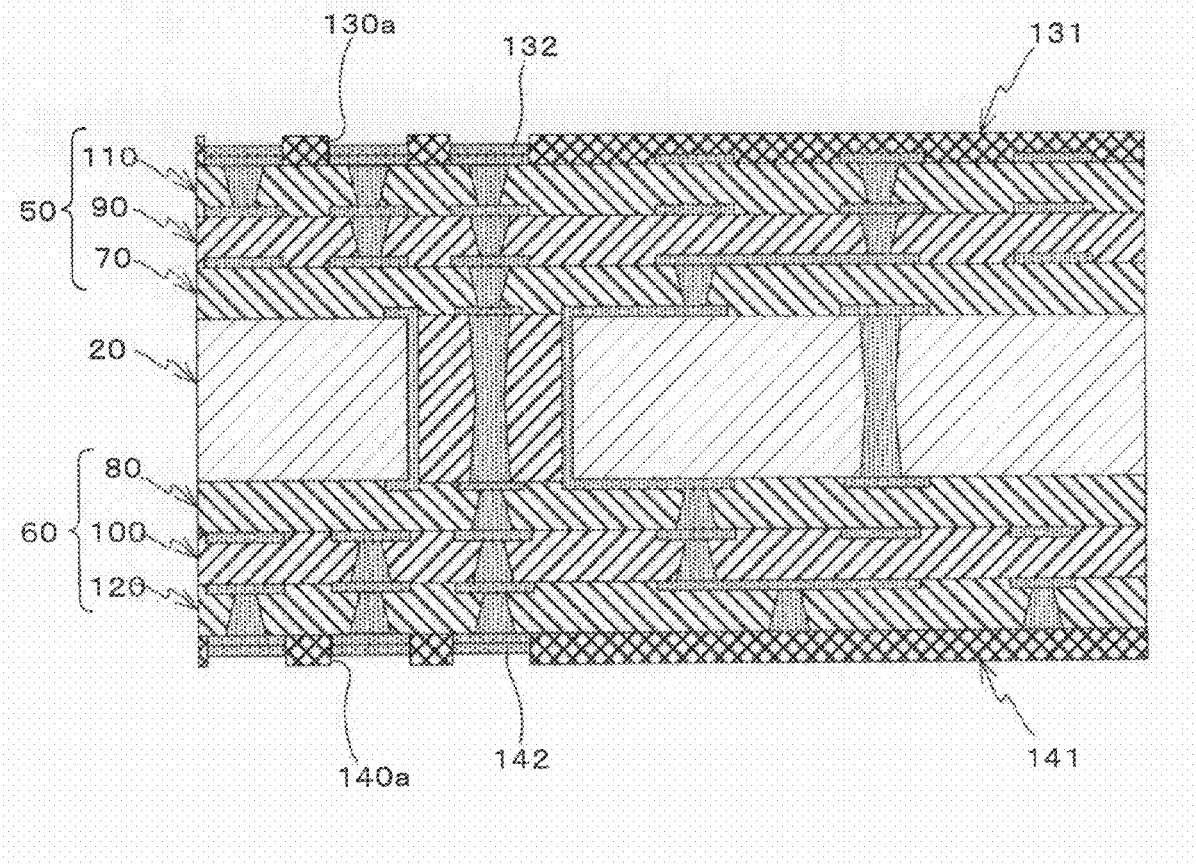
FIG. 8A is a view showing a step for surface treatment, following the steps for forming built-up layers shown in FIGS. 7A and 7B.

Next, as shown in FIG. 8A, solder connection layers (132, 142) are formed in opening portions (130a, 140a) respectively. Solder connection layers (132, 142) are plated layers to enhance the solderability of solder pads, and they are formed with a nickel-plated layer and a gold-plated layer.

The nickel-plated layer is formed by immersing the laminate in an electroless nickel-plating solution, and the gold-plated layer is formed by immersing the laminate in an electroless gold-plating solution. Here, solder connection layers (132, 142) may also be formed as triple layers such as nickel-palladium-gold plated layers. Alternatively, solder connection layers (132, 142) may be formed as single-plated layers using gold, silver or tin. They may also be formed with resin films such as flux.

Figure 8B:
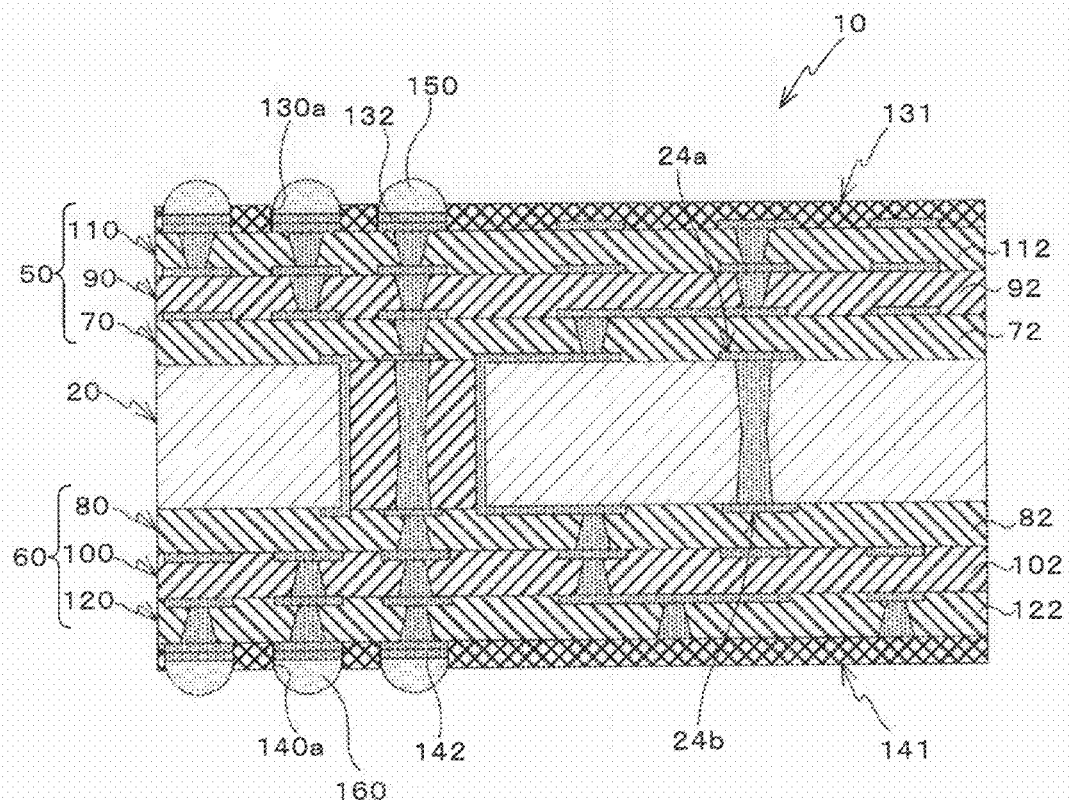
FIG. 8B is subsequent to FIG. 8A, a view showing a step for surface treatment.

Next, as shown in FIG. 8B, solder paste is printed on solder connection layers (132, 142) and reflowed. Accordingly, external connection terminals (150, 160) are formed. Through the above procedures, wiring board 10 is manufactured.

In the present embodiment, the direction of electric current in outer through-hole conductor 38 is set different from the direction of electric current in inner through-hole conductor 40. Accordingly, part of the magnetic flux generated by the electric current flowing through outer through-hole conductor 38 and part of the magnetic flux generated by the electric current flowing through inner through-hole conductor 40 are offset from each other. Therefore, transmission line impedance decreases, and malfunctions or operational delays are suppressed from occurring in the CPU or MPU.

In addition, since impedance in a transmission line decreases, voltage losses are reduced. Thus, it is not required that a chip capacitor for a supply of constant voltage be inserted into the transmission line. As a result, manufacturing costs are reduced.

Also, in the present embodiment, VRM inductors are formed in a wiring board to install a VRM in the wiring board. Thus, power is supplied to a CPU without losing voltage. Accordingly, the number of chip capacitors to supply constant voltage is reduced.

Figure 9:
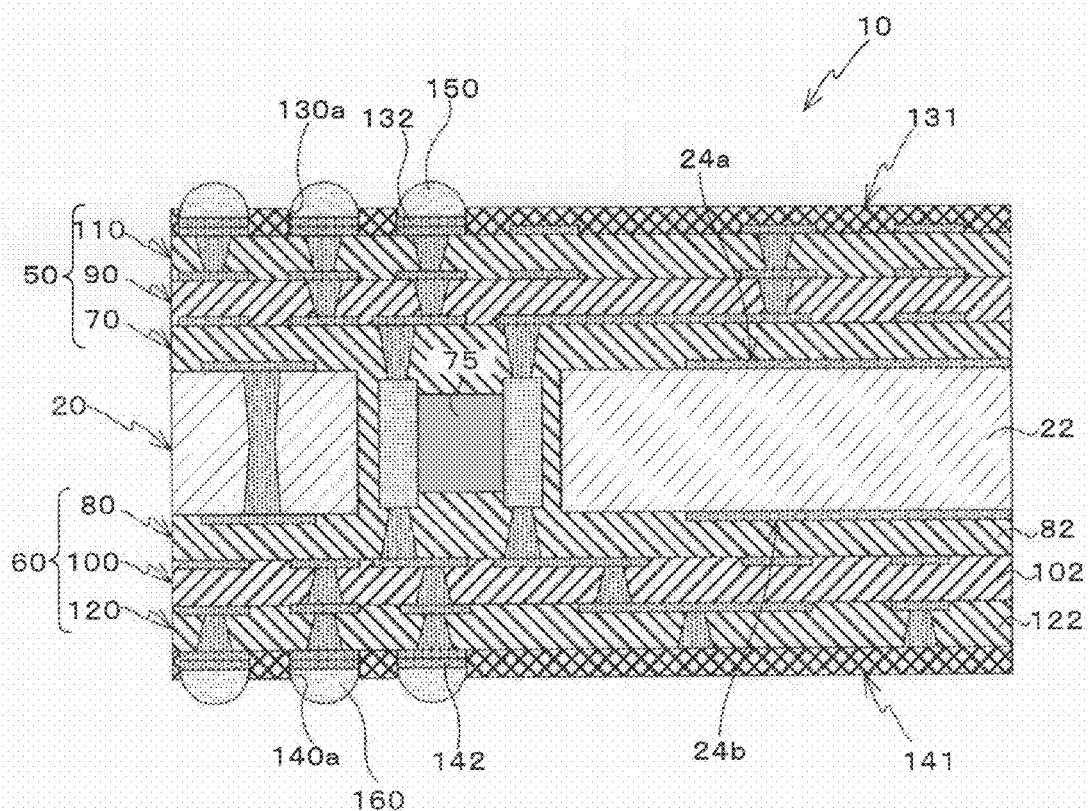
FIG. 9 is a cross-sectional view showing a wiring board according to another embodiment of the present invention.
Figure 10:
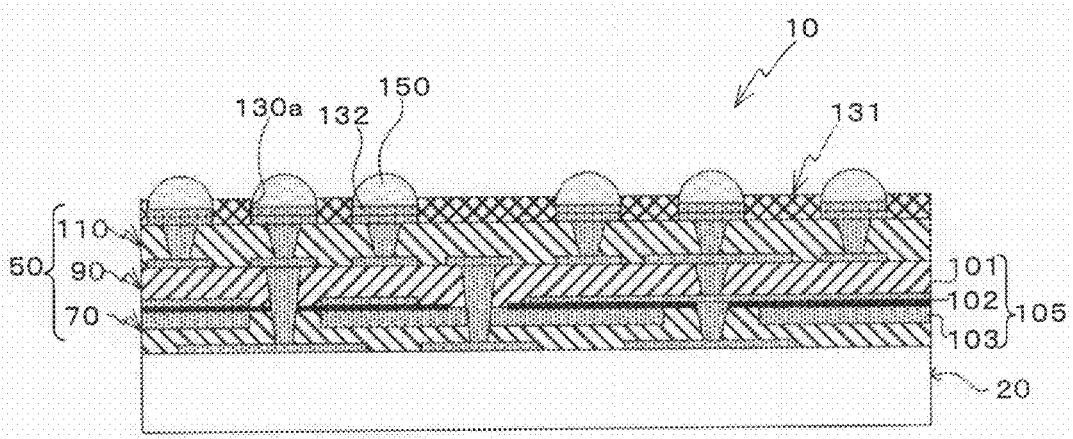
FIG. 10 is a cross-sectional view partially showing a wiring board according to yet another embodiment of the present invention.

Moreover, a capacitor required for a VRM may be set in a wiring board. For example, as shown in FIG. 9, chip capacitor 75 may be arranged in insulative substrate 22. Alternatively, thin-film capacitor 105 may be arranged on an insulation layer as shown in FIG. 10. Such thin-film capacitor 105 is formed with a pair of electrodes (101, 103) that face each other and ceramic dielectric layer 102 sandwiched between them.

In the present embodiment, first conductive portion 28 and first conductive circuit (24a) are positioned on substantially the same plane. Also, second conductive portion 34 and second conductive circuit (24b) are positioned on substantially the same plane. Accordingly, the length of second penetrating hole (36a) in the thickness direction of wiring board 10 becomes shorter than its conventional counterpart. In other words, the aspect ratio (depth/diameter) of second penetrating hole (36a) becomes smaller. Thus, plating results are improved when filling inner through-hole conductor 40. Accordingly, voids are suppressed from occurring in inner through-hole conductor 40.

A wiring board according to the present invention is not limited to the above embodiment, and various modifications may be made within a scope that does not deviate from the gist of the invention.

For example, the quality, size, the number of layers and so forth of each layer may be modified freely in the above embodiment.

Also, in wiring board 10 of the above embodiment, built-up layers (50, 60) on both surfaces of core substrate 20 are formed to have a triple-layer structure, respectively having first layer 70, second layer 90 and third layer 110 and first layer 80, second layer 100 and third layer 120. However, built-up layers are not limited to such, and they may be formed to have a single-layer structure, a double-layer structure or a structure with four or more layers. Alternatively, the number of layers that form built-up layers (50, 60) may differ from each other. Yet alternatively, such a built-up layer may be formed only on one main surface. Moreover, external connection terminals for connection with an electronic component may only be formed on one main surface of a wiring board.

The steps for manufacturing a wiring board described in the above embodiment may be modified properly within a scope that does not deviate from the gist of the present invention. In addition, some processes may be omitted according to usage requirements or the like. For example, conductive patterns of wiring layers may be formed by a semi-additive method, subtractive method, or any other method.

A wiring board according to one aspect of the present invention has the following: a substrate having a first surface and a second surface in which a first penetrating hole is formed; a first conductive circuit formed on the first surface of the substrate; a second conductive circuit formed on the second surface of the substrate; a first through-hole conductor formed on the inner wall of the first penetrating hole and electrically connecting the first conductive circuit and the second conductive circuit; a filler filled inside the first through-hole conductor and having a second penetrating hole; a first conductive portion formed on one side of the filler; a second conductive portion formed on the other side of the filler; and a second through-hole conductor formed in the second penetrating hole and electrically connecting the first conductive portion and the second conductive portion. In such a wiring board, the thickness of the first conductive circuit is set greater than the thickness of the first conductive portion.

A method for manufacturing a wiring board according to another aspect of the present invention includes the following: forming a first penetrating hole in a substrate having a first surface and a second surface; forming a first through-hole conductor on the inner wall of the first penetrating hole; on the first surface and the second surface of the substrate, performing plating to form conductive circuits to be connected by the first through-hole conductor; filling a filler in the first through-hole conductor; forming a second penetrating hole in the filler; forming a second through-hole conductor in the second penetrating hole by filling a conductive material; and on one side and the other side of the filler, performing plating to form conductive portions to be connected by the second through-hole conductor. Here, the conductive circuits are formed to be thicker than the conductive portions.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
    a substrate having a first surface and a second surface on an opposite side of the first surface, the substrate having a first penetrating hole penetrating through the substrate between the first surface and the second surface, a first through-hole conductor formed on an inner wall of the first penetrating hole, a filler filled inside the first through hole conductor and forming a second penetrating hole in the first penetrating hole, and a second through-hole conductor formed in the second penetrating hole;
    a first conductive circuit formed on the first surface of the substrate comprising a metal foil layer;
    a second conductive circuit formed on the second surface of the substrate comprising a metal foil layer;
    a first conductive portion formed on one end of the second penetrating hole; and a second conductive portion formed on an opposite end of the second penetrating hole,
    wherein the first through-hole conductor is connecting the first conductive circuit and the second conductive circuit, the second through-hole conductor is connecting the first conductive portion and the second conductive portion, the first conductive circuit has a thickness which is set greater than a thickness of the first conductive portion, the second through-hole conductor comprises a conductive material deposited in the second penetrating hole, the first and second conductive portions integrally include the conductive material of the second penetrating hole,
    the first conductive circuit comprises a first electroless plated layer, a first electrolytic plated layer, a second electroless plated layer and a second electrolytic plated layer formed on the metal foil layer of the first conductive circuit, the second conductive circuit comprises a first electroless plated layer, a first electrolytic plated layer, a second electroless plated layer and a second electrolytic plated layer formed on the metal foil layer of the second conductive circuit, the first conductive portion formed on the one end of the second penetrating hole comprises an electroless plated layer and an electrolytic plated layer, the second conductive portion formed on the opposite end of the second penetrating hole comprises an electroless plated layer and an electrolytic plated layer, and the conductive material of the second through-hole conductor comprises an electrolytic plated metal forming the electrolytic plated layers of the first and second conductive portions.

2. The wiring board according to claim 1, wherein the electrolytic plated metal of the second through-hole conductor is filling in the second penetrating hole.

3. The wiring board according to claim 1, wherein each of the metal foil layers of first and second conductive circuits comprises a copper foil formed on the substrate.

4. The wiring board according to claim 3, wherein the electrolytic plated metal of the second through-hole conductor is filling the second penetrating hole.

5. The wiring board according to claim 4, wherein the first conductive circuit has a protruding portion protruding from a periphery portion of the first penetrating hole toward the second penetrating hole, and the first conductive circuit has a thickness which is greater than a thickness of the protruding portion of the first conductive circuit.

6. The wiring board according to claim 4, wherein the first conductive circuit has a protruding portion protruding from a periphery portion of the first penetrating hole toward the second penetrating hole, the first conductive circuit has a thickness which is greater than a thickness of the protruding portion of the first conductive circuit, and the thickness of the protruding portion of the first conductive circuit is equal to the thickness of the first conductive portion.

7. The wiring board according to claim 1, wherein the first through-hole conductor and the second through-hole conductor are set to have equal electrical potential.

8. The wiring board according to claim 1, wherein the first through-hole conductor and the second through-hole conductor are power-supply through-hole conductors.

9. The wiring board according to claim 1, wherein the substrate has a third penetrating hole penetrating through the substrate between the first surface and the second surface, a third through-hole conductor formed on an inner wall of the third penetrating hole, a filler filled inside the third through-hole conductor and forming a fourth penetrating hole, and a fourth through-hole conductor formed in the third penetrating hole, the first through-hole conductor and the second through-hole conductor are coaxial and form a first through-hole structure, the third through-hole conductor and the fourth through-hole conductor are coaxial and form a second through-hole structure, the first through-hole conductor of the first through-hole structure and the fourth through-hole conductor of the second through-hole structure are electrically connected, and the second through-hole conductor of the first through-hole structure and the third through-hole conductor of the second through-hole structure are electrically connected.

10. The wiring board according to claim 1, wherein the first through-hole conductor and the second through-hole conductor form an inductor.

11. The wiring board according to claim 1, wherein the first through-hole conductor has an aspect ratio which is one or smaller.

12. The wiring board according to claim 1, wherein the first conductive portion has a width which is greater than a width of the second through-hole conductor.

13. The wiring board according to claim 1, wherein the first conductive circuit has a protruding portion protruding from a periphery portion of the first penetrating hole toward the second penetrating hole, and the first conductive circuit has a thickness which is greater than a thickness of the protruding portion of the first conductive circuit.

14. The wiring board according to claim 1, wherein the first conductive circuit has a protruding portion protruding from a periphery portion of the first penetrating hole toward the second penetrating hole, the first conductive circuit has a thickness which is greater than a thickness of the protruding portion of the first conductive circuit, and the thickness of the protruding portion of the first conductive circuit is equal to the thickness of the first conductive portion.

15. The wiring board according to claim 1, wherein the first conductive circuit has a protruding portion protruding from a periphery portion of the first penetrating hole toward the second penetrating hole, and the protruding portion comprises the second electroless plated layer of the first conductive circuit and the second electrolytic plated layer of the first conductive circuit.

16. The wiring board according to claim 1, wherein the first conductive circuit has a first protruding portion protruding from a periphery portion of the first penetrating hole toward the second penetrating hole, the second conductive circuit has a second protruding portion protruding from the periphery portion of the first penetrating hole toward the second penetrating hole, the protruding portion comprises the second electroless plated layer of the first conductive circuit and the second electrolytic plated layer of the first conductive circuit, and the protruding portion comprises the second electroless plated layer of the second conductive circuit and the second electrolytic plated layer of the second conductive circuit.

17. The wiring board according to claim 1, wherein the metal foil layers of the first and second conductive circuits are copper foils, respectively, the first electroless plated layers of the first and second conductive circuits are electroless plated copper layers, the first electrolytic plated layers of the first and second conductive circuits are electrolytic plated copper layers, the second electroless plated layers of the first and second conductive circuits are electroless plated copper layers, and the second electrolytic plated layers of the first and second conductive circuits are electrolytic plated copper layers.

18. The wiring board according to claim 1, wherein the electrolytic plated metal of the second through-hole conductor is formed in the second penetrating hole.

* * * * *